United States Patent
Wang et al.

(10) Patent No.: US 10,121,637 B2
(45) Date of Patent: Nov. 6, 2018

(54) MULTI-PLATEN ION IMPLANTER AND METHOD FOR IMPLANTING MULTIPLE SUBSTRATES SIMULTANEOUSLY

(71) Applicant: Taiwan Semiconductor Manufacturing Co., Ltd., Hsin-Chu (TW)

(72) Inventors: Shao-Hua Wang, Hsinchu (TW); Ming-Te Chen, Hsinchu (TW); Sheng-Wei Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/798,581

(22) Filed: Mar. 13, 2013

(65) Prior Publication Data

US 2014/0272178 A1    Sep. 18, 2014

(51) Int. Cl.
C23C 14/48 (2006.01)
H01J 37/317 (2006.01)
H01J 37/20 (2006.01)

(52) U.S. Cl.
CPC .......... *H01J 37/3171* (2013.01); *H01J 37/20* (2013.01); *H01J 2237/201* (2013.01); *H01J 2237/20214* (2013.01); *H01J 2237/20228* (2013.01)

(58) Field of Classification Search
CPC .................................................. H01J 37/3171
See application file for complete search history.

(56) References Cited

U.S. PATENT DOCUMENTS

| | | | |
|---|---|---|---|
| 4,733,091 A * | 3/1988 | Robinson et al. | 250/492.2 |
| 4,816,693 A * | 3/1989 | Rathmell | 250/492.2 |
| 4,929,840 A * | 5/1990 | Dykstra | H01L 21/68 250/397 |
| 7,312,464 B2 * | 12/2007 | Sohtome | 250/492.21 |

(Continued)

FOREIGN PATENT DOCUMENTS

KR    10-2007-0055596    5/2007

OTHER PUBLICATIONS

Official Action dated Oct. 31, 2014 in counterpart Korean patent application No. 10-2013-0150734.

(Continued)

*Primary Examiner* — David P Turocy
*Assistant Examiner* — Mohammad Mayy
(74) *Attorney, Agent, or Firm* — Duane Morris LLP

(57) ABSTRACT

An ion implantation apparatus and a method for ion implantation provides for implanting multiple substrates simultaneously. The different substrates are on corresponding platens within an ion implantation chamber or they may be positioned on separate substrate holders on a single oversized platen. The substrates and platen or platens, are translatable with respect to an ion beam, the individual substrates are rotatable and the position of the substrates relative to one another in the ion implantation chamber are movable. By rotating, translating and repositioning substrates during the ion implantation process, the entirety of all substrates are implanted by an ion beam even when the ion beam has a relatively small footprint and a relatively short scan length, compared to the diameters of the substrates undergoing implantation.

10 Claims, 7 Drawing Sheets

(56) References Cited

U.S. PATENT DOCUMENTS

| | | | |
|---|---|---|---|
| 7,375,354 B2* | 5/2008 | Iwasawa | H01J 37/3171 250/492.21 |
| 2005/0121626 A1* | 6/2005 | Sheng | H01J 37/3171 250/492.21 |
| 2006/0057303 A1 | 3/2006 | Agarwal et al. | |
| 2007/0080291 A1* | 4/2007 | Buijsse | H01J 37/18 250/311 |
| 2011/0186748 A1* | 8/2011 | Ruffell | 250/400 |
| 2012/0080308 A1* | 4/2012 | Kameyama | C23C 14/221 204/192.11 |

OTHER PUBLICATIONS

Official Action dated Oct. 26, 2016 in counterpart Korean patent application No. 10-2016-0124974.

* cited by examiner

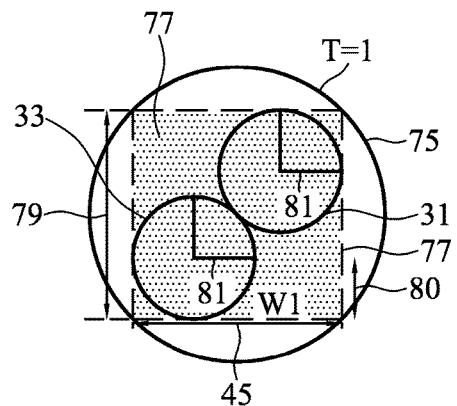 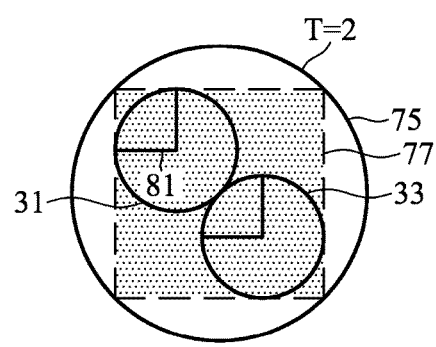
FIG. 5A         FIG. 5B
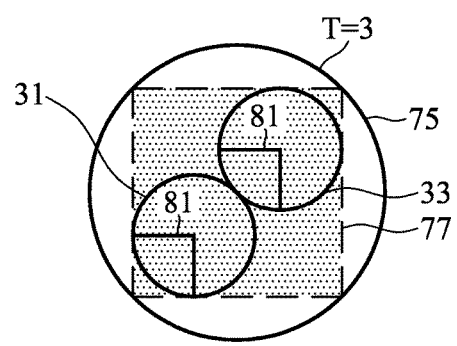 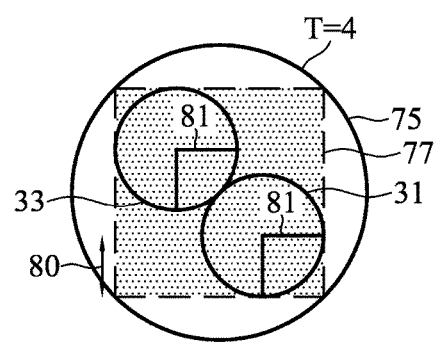
FIG. 5C         FIG. 5D

US 10,121,637 B2

MULTI-PLATEN ION IMPLANTER AND METHOD FOR IMPLANTING MULTIPLE SUBSTRATES SIMULTANEOUSLY

TECHNICAL FIELD OF THE DISCLOSURE

The disclosure relates to semiconductor manufacturing and more particularly to high-throughput apparatuses and methods for ion implantation of semiconductor devices on semiconductor substrates.

BACKGROUND

Semiconductor devices are used extensively in various electronic and other devices throughout the world. Semiconductor devices, typically formed as integrated circuits and also known as chips, are fabricated on substrates and each substrate includes hundreds or even thousands of chips. In today's semiconductor manufacturing industry, there is a constant drive to increase substrate sizes thereby increasing the number of chips that can be formed on a substrate. Each substrate undergoes processing through multiple processing operations using multiple manufacturing tools and the use of larger substrates enables a greater number of chips to be processed in a single processing operation. As substrates sizes continue to increase to allow a greater number of chips to be formed on a substrate, however, the equipment that processes the substrates must be scaled accordingly.

One limitation in processing increasingly larger substrates is the physical size limitation in manufacturing larger processing tools. Another limitation is in uniformity of the conditions producible throughout a processing chamber. Non-uniformities are introduced when equipment is manufactured past a critical uniformity state. For one example, in an ion implantation manufacturing tool, there are limitations in the size, i.e. footprint, of an ion beam that can be uniform throughout the footprint. For another example, in an etching tool, there are limitations in the uniformity of the electric field and the plasma that can be achieved across an increasingly large processing chamber sized to accommodate increasingly larger substrates.

There is also a drive to increase throughput, i.e. the number of chips that can be processed in a given time period. In view of the limitations in manufacturing larger processing tools with acceptable processing uniformities, innovative ways for processing large numbers of increasingly larger substrates through manufacturable processing tools, are needed.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 5A-5D show two substrates being implanted by a single ion beam according to an embodiment of the disclosure;

DETAILED DESCRIPTION

The disclosure provides an ion implantation apparatus and a method for carrying out ion implantation of substrates. Instead of ion implanting one substrate at a time, the disclosure provides for implanting two or more substrates in an ion implantation chamber of an ion implantation apparatus at the same time. In one embodiment, the multiple substrates are provided on a single platen capable of receiving multiple substrates and further capable of translating and rotating within the apparatus and with respect to the ion beam. In another embodiment, the multiple substrates are each disposed on a corresponding platen in the ion implantation chamber and the multiple platens are translatable with respect to the ion beam. The multiple platens are also capable of rotation and curvilinear or other motion with respect to the ion beam in some embodiments. The curvilinear or other motion takes place along a plane that includes the substrate surfaces in some embodiments. The curvilinear motion includes the individual platens being revolvable around a position in the plane in which the substrates are held, in one embodiment. In this manner, an ion beam can have a footprint, i.e. the cross-sectional area of the beam as it impinges upon the x-y plane of the substrate or substrates, that has no lateral dimension as great as two substrate diameters in a system in which the scan area is not as long as the diameter of two substrates, yet multiple substrates can be implanted by the ion beam in a single operation. The single operation includes translation of the substrates and/or rotation of the substrates and/or motion relative to one another, by the substrates and with respect to the ion beam, such that multiple substrates are implanted simultaneously in one processing operation. In some embodiments, the translating, rotation and motion of the substrates with respect to one another, take place simultaneously during an ion implantation processing operation or series of ion implantation processing operations.

Figure 1:
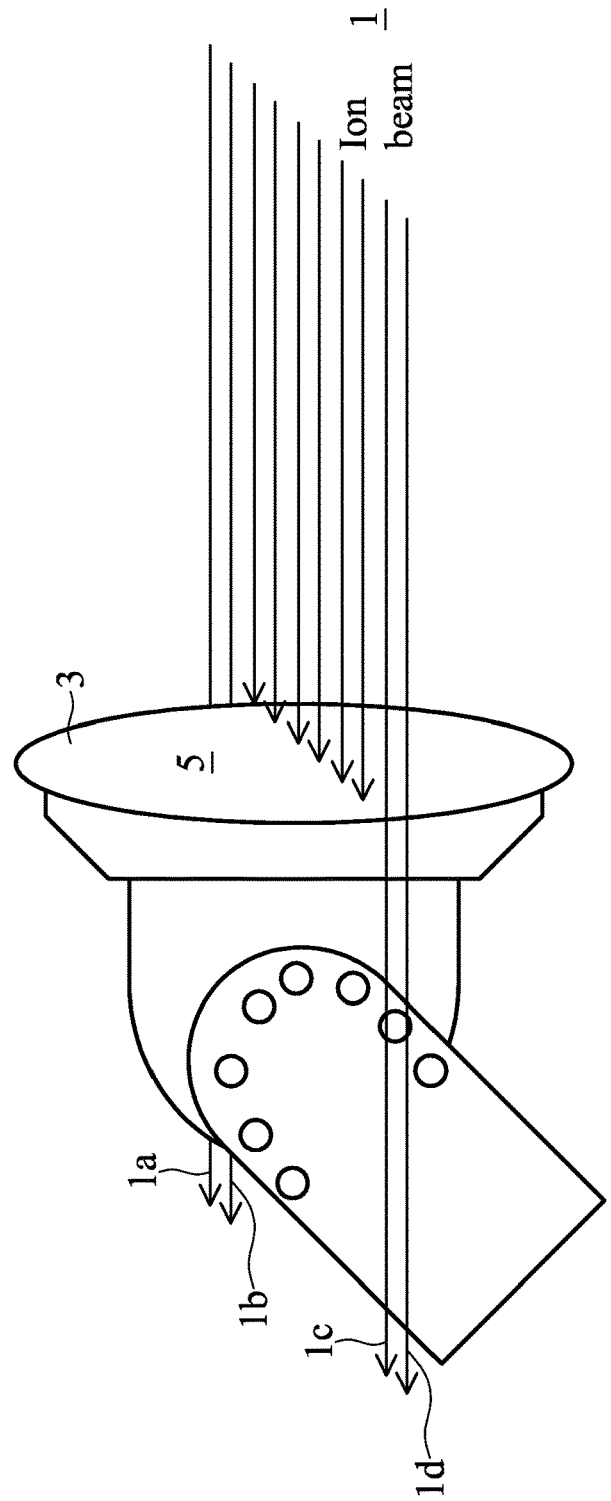
FIG. 1 is a perspective view showing an ion beam impinging upon a single substrate.

FIG. 1 is a perspective view showing an ion beam impinging on a substrate surface in an ion implantation chamber of an ion implantation apparatus. Ion beam 1 is represented by the series of arrows shown parallel in FIG. 1. Ion beam 1 is generated by any of various ion beam generators that generate an ion beam and direct the ion beam to substrates or substrate holders disposed in an ion implantation chamber of an ion implantation tool. Substrate 3 is on a platen and includes substrate surface 5 which is undergoing the ion implantation operation i.e. "being implanted". In the illustrated embodiment, ion beam 1 impinges upon surface 5 substantially orthogonally, but in other embodiments, such as when angled ion implantation methods are used, ion beam 1 impinges upon substrate 5 at different angles. With substrate surface 5 in the x-y plane, ion beam 1 is generally directed along the z-direction. It can be seen that some of the beams such as beams 1a-1d are not directed to substrate 1. Ion beam 1 is generated in various types of ion implantation tools in various embodiments. Ion beam 1 includes various ionic species in various embodiments. Ion beam 1 includes various energies used in ion implantation processes and may implant ionic dopant impurities to various dosage levels and various depths in substrate 3. The ion implantation apparatus and method of the disclosure is used to carry out ion implantation processing operations on various types and sizes of substrates and in carrying out various ion implantation processing operations.

Figure 2:
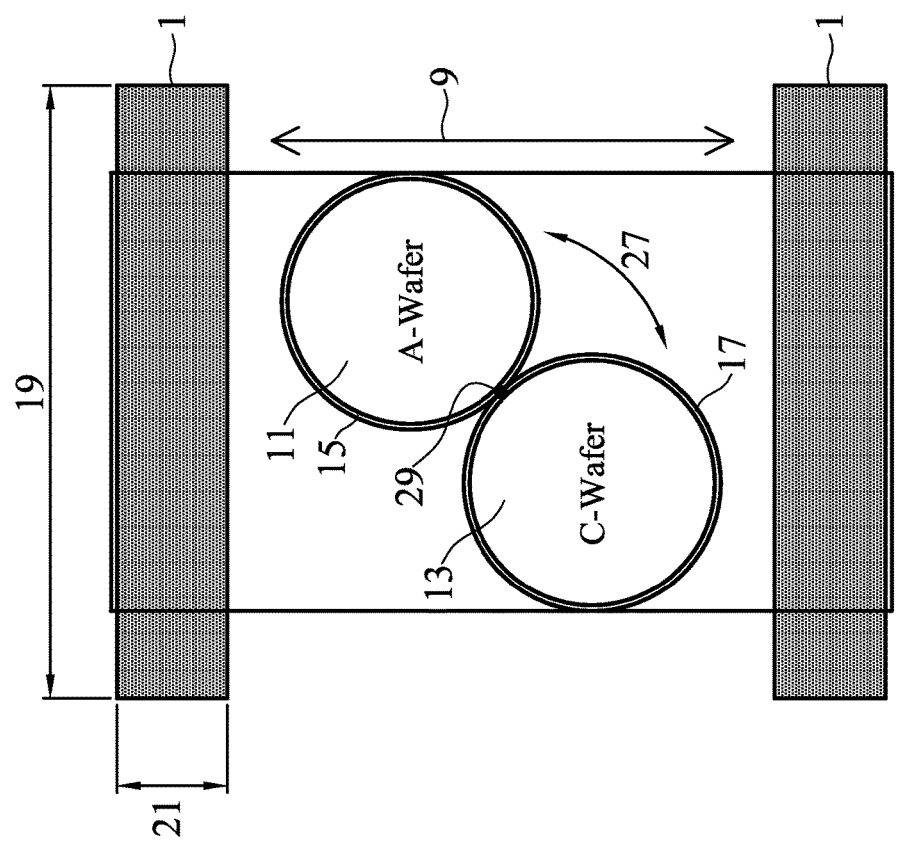
FIG. 2 is a top, plan view showing relative motion between an ion beam and a duality of substrates.

FIG. 2 is a plan view showing an embodiment of multiple substrates undergoing an ion implantation process together. FIG. 2 shows two substrates, A-wafer 11 and C-wafer 13, aligned within a plane within an ion implantation chamber of an ion implantation apparatus. In one embodiment, A-wafer 11 is on corresponding platen 15 and C-wafer 13 is on corresponding platen 17. In another embodiment, A-wafer 11 and C-wafer 13 are on one large platen capable of receiving multiple substrates and further capable of translating and rotating within the apparatus. According to the one large platen embodiment, the platen includes multiple substrate holders for retaining the multiple substrates A-wafer 11 and C-wafer 13.

Returning to FIG. 2, platens 15 and 17 translate along linear direction 9 with respect to ion beam 1, which is in fixed position although other relative translational motion takes place in other embodiments. Ion beam 1 is defined by a footprint including length 21 and width 19 and the footprint can also be described as the ion implantation area of ion beam 1, i.e. length 21 times width 19 in the x-y plane of the substrates A-wafer 11 and C-wafer 13. Although ion beam 1 is in fixed position, it should be understood that ion beam 1 is shown in two different locations to indicate the relative movement of substrates A-wafer 11 and C-wafer 13 with respect to ion beam 1. A-wafer 11 and C-wafer 13 are translatable along direction 9 and each translation of the substrates along direction 9 is known as a scan. The substrates A-wafer 11 and C-wafer 13 are capable of backward and forward motion along direction 9 and in one embodiment, a plurality of scans is carried out, each scan being in the opposite direction as the previous scan, but other scan sequences are used in other embodiments.

A-wafer 11 and C-wafer 13 are each also capable of rotating within the plane that includes substrates A-wafer 11 and C-wafer 13. Ion beam 1 is directed to the surfaces of A-wafer 11 and C-wafer 13 in a direction that is generally orthogonal to the surfaces of the substrates in one embodiment, but ion beam 1 is angled with respect to the substrates in other embodiments. Substrates A-wafer 11 and C-wafer 13 are also capable of motion with respect to one another in the x-y plane and the motion is curvilinear motion in one embodiment. Curvilinear motion is indicated by curved arrow 27 in one embodiment, which is indicative of the direction of motion of each of platens 15 and 17 relative to one another. In one embodiment, platens 15 and 17 revolve around a fixed point, such as point 29, but other curvilinear movement is used in other embodiments. The curvilinear motion, in conjunction with translational motion along direction 9, and rotation of the substrates, enables the implantation of the entirety of each of substrates A-wafer 11 and C-wafer 13 in one pass of ion beam 1 in some embodiments. In this manner, two substrates are implanted together, i.e. in the same ion implantation chamber during the same ion implantation operation. The curvilinear motion and direction 9 are along the x-y plane and it should be understood that ion beam 1 is generally directed toward substrates A-wafer 11 and C-wafer 13 along the z-axis.

Figure 3:
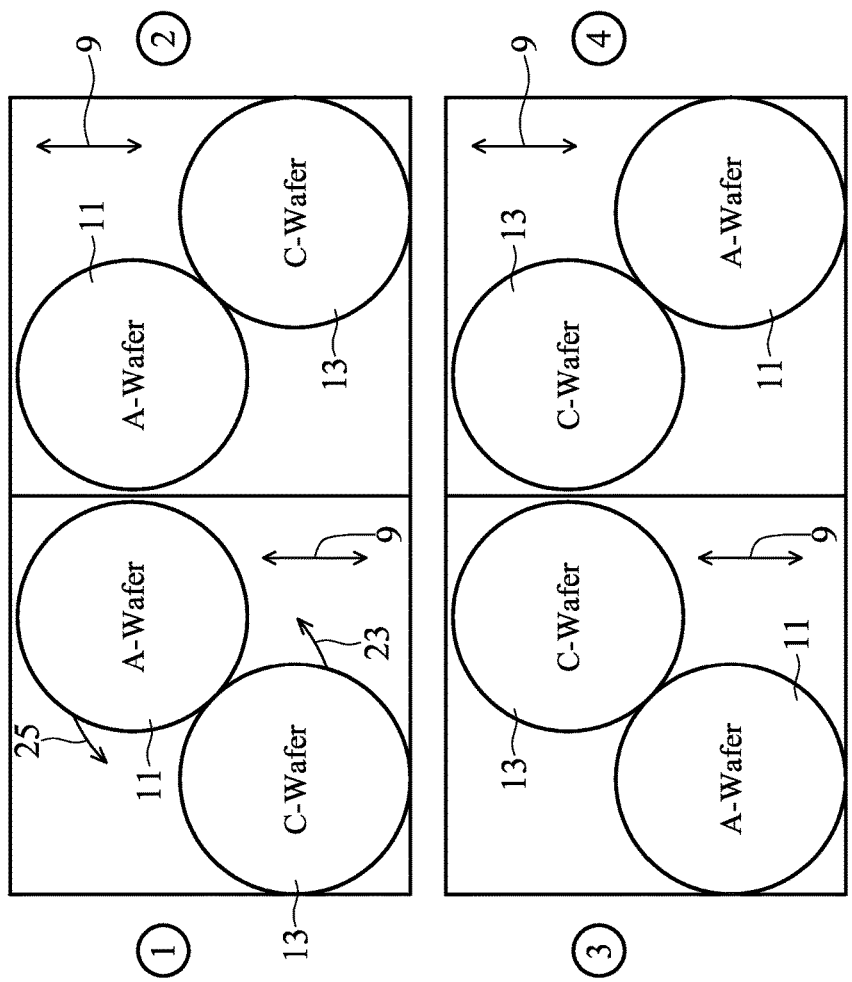
FIG. 3 includes four top, plan views of different arrangements of multiple substrates in an ion implantation chamber of an ion implantation tool.

FIG. 3 illustrates arrangements 1-4 according to one embodiment. Each arrangement includes two substrates: A-wafer 11 and C-wafer 13. Arrangements 1-4 show the two substrates A-wafer 11 and C-wafer 13 in different relative positions. In each embodiment, the arrangement represents the two substrates A-wafer 11 and C-wafer 13 generally arranged in a co-planar manner in an ion implant implantation chamber of an ion implantation apparatus.

In one embodiment, each of the different arrangements 1-4 represents different fixed positions in which the substrates A-wafer 11 and C-wafer 13, are placed with respect to one another in an ion implantation apparatus. In each arrangement, the substrates translate backward and forward along direction 9 relative to a fixed ion beam such that both substrates A-wafer 11 and C-wafer 13, undergo ion implantation. In one embodiment, each substrate A-wafer 11 and C-wafer 13 is on a corresponding platen that retains one substrate and in another embodiment, the two substrates A-wafer 11 and C-wafer 13 are on a large platen that retains both substrates. In some embodiments, the large platen includes multiple substrate holders for retaining multiple substrates. Substrates A-wafer 11 and C-wafer 13 undergo various ion implantation operations for various purposes as described above.

In another embodiment, the four arrangements 1-4 represent a sequence of the positions of substrates A-wafer 11 and C-wafer 13 during a single and continuous ion implantation operation. A-wafer 11 and C-wafer 13 move with respect to one another while undergoing an ion implantation operation. According to this embodiment, the substrates 11, 13 may be received on a single platen that is rotatable or substrates A-wafer 11 and C-wafer 13 may be on individual platens capable of curvilinear or other motion with respect to one another. In one embodiment, the respective individual platens revolve around a point within the ion implantation chamber of an ion implantation apparatus. For example, arrows 23 and 25 indicate the direction of movement of substrates A-wafer 11 and C-wafer 13, respectively, from arrangement 1 to arrangement 2. Arrangements 1-4 show a sequence of the relative positions of substrates A-wafer 11 and C-wafer 13 during the progression of an ion implantation operation. Substrate A-wafer 11 and C-wafer 13 change relative position while the ion implantation operation is carried out. In other embodiments, the respective individual platens are capable of other translational curvilinear motion with respect to one another within the ion implantation apparatus. According to the embodiment in which substrates A-wafer 11 and C-wafer 13 are on a single platen, rotation of the platen may be used to bring about the different relative positions shown in arrangements 1-4. According to either of the aforementioned embodiments in which the substrates are on corresponding individual platens, the platens are rotatable.

Still referring to FIG. 3, in one embodiment, the four arrangements 1-4 represent a sequence of substrate positions during an ion implantation processing operation. According to this embodiment, the substrates translate backward and forward along direction 9 and in one embodiment, the substrates while in arrangement 1, undergo a scan along direction 9 in a first direction and while in arrangement 2, the substrates undergo a scan along direction 9 in the opposite direction and in arrangement 3 the substrates undergo a scan along direction 9 in the first direction and in arrangement 4 the substrates undergo a scan along direction 9 in the opposite direction. In each scan, the scan speed along linear direction 9 may be constant or it may vary during the scan. In one embodiment, each of the substrate A-wafer 11 and C-wafer 13 rotate and are in different rotational positions for each successive scan. (This will be illustrated in FIGS. 6A-6E.). In one embodiment, the ion implantation apparatus includes a programmable processor that is programmed to carry out instructions for the above-described sequence of an ion implantation processing operation.

Figure 4:
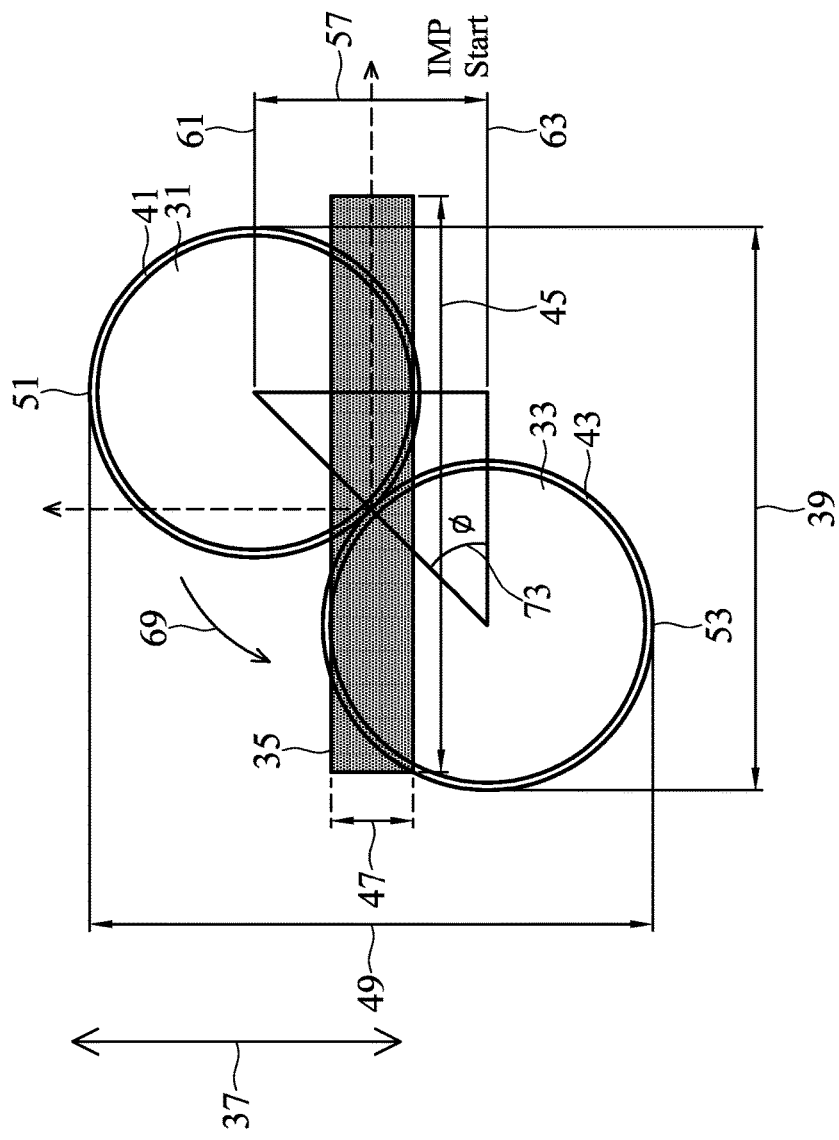
FIG. 4 shows details of an arrangement of two substrates in an ion implantation chamber of an ion implantation apparatus with respect to an ion beam.

FIG. 4 shows two substrates—substrate 31 and substrate 33 with respect to ion beam 35 in an ion implantation chamber. Ion beam 35 includes an implant area in the x-y plane of substrates 31, 33, i.e., a footprint, defined by height 47 and width 45. Scan length 57 represents the extent of the region reached by the ion beam 35 due to translation of substrates 31, 33 backward and forward along direction 37, i.e. the scan length, in one embodiment. In one embodiment, substrates 31, 33 are received on individual corresponding platens 41, 43, respectively. As described above with respect to FIGS. 2 and 3, the substrates 31, 33 are translatable backward and forward along direction 37, each of substrates 31 and 33 is rotatable about its axis and substrates 31, 33 are movable with respect to one another in some embodiments. In one embodiment, substrates 31, 33 are movable with respect to one another such as shown in the four arrangements of FIG. 3 but substrates 31, 33 are movable with respect to one another in other manners in other embodiments. Each substrate 31, 33 includes a diameter and in the illustrated arrangement, the two substrates 31, 33 are arranged to have a total width 39 and a total height 49, each less than 2 times the diameter of the individual substrates 31, 33.

The height 47 and width 45 of the footprint of ion beam 35 in the x-y plane of substrates 31, 33 is less than 2 times the diameter of substrates 31, 33 in the illustrated embodiment. The relative placement of substrates 31, 33 is varied in other embodiments such that, for a fixed substrate size, total width 39 and total height 49 vary in various embodiments. In some embodiments, the relative positioning of substrates 31, 33 depends on width 45 and height 47 of ion beam implantation area of ion beam 35. In one embodiment, substrates 31, 33 include a diameter of about 300 mm but other size substrates such as 450 mm substrates, are used in other embodiments. In one embodiment, e. g. in which scan length 57 of ion beam 35 is equal to or greater than total height 49, the translation of substrates 31, 33 along direction 37 enables the entire arrangement from point 51 to point 53 to be scanned under ion beam 35 and thus, implanted. According to this embodiment, the two substrates 31, 33 each pass completely beneath ion beam 35 in one continuous scan. According to this embodiment, either or both of substrates 31, 33 rotate during the implantation process.

In some embodiments, substrates 31, 33 are positioned such that total width 39 is equal to or less than width 45 of ion beam 35 and in other embodiments, substrates 31, 33 are positioned such that total width 39 is greater than width 45 of ion beam 35. According to this embodiment, in which a scan of the ion beam 35 does not extend to all portions of substrates 31, 33 in the x-direction, substrates 31, 33 are rotated and/or moved with respect to one another such that all portions of substrates 31, 33, receive ion implantation during an ion implantation scan.

Stated alternatively, if the ion implantation area defined by a beam including a footprint having a width of x and a scan length of y and the plurality of substrates are positioned such that they are not completely within an area xy, the substrates are rotated and/or moved with respect to one another such that all portions of the substrates receive ion implantation during an ion implantation scan.

FIG. 4 also shows that for a given width 45 of ion beam 35, if the two substrates are arranged so that total height 49 lies completely within scan length 57 of ion beam 35, angle 73 is a critical angle below which the total width 39 of substrates 31,33 exceed width 45 of ion beam 35. If angle 73 is below the critical value, then the substrates 31, 33 must be rotated in order to be implanted by ion beam 35 in one scan. In one apparatus embodiment in which substrates 31, 33 have a diameter of 300 mm, and width 45 of ion beam 35 is 410 mm, angle 73 is about 70 degrees, but other arrangements are used in other apparatus embodiments with different scan length capabilities.

Scan length 57 indicates that, by translation or motion of substrates 31 and 33 along direction 37, the effective ion beam implantation area extends from point 61 to point 63. In one embodiment, scan length 57 is about 380 mm and in another embodiment, scan length 57 is about 650 mm and in another embodiment, scan length 57 equals total length 49 but other scan lengths are utilized in other embodiments. According to the embodiment in which the effective scan length 57 indicates that ion beam 35 cannot extend from point 51 to point 53, various techniques are used to completely implant substrates 31, 33 while ion beam 35 scans forward and backward along scan length 57. In one embodiment, each of substrates 31, 33 rotates such that the entirety of each substrate 31, 33 undergoes implantation even though ion beam 35 only extends from point 61 to point 63. In some embodiments, ion beam 35 scans up and down several times during an implantation operation. In some embodiments, substrates 31, 33 rotate continuously or repeatedly. In other embodiments, substrates 31, 33 each rotate in stages. According to one exemplary embodiment, ion beam 35 scans in a first direction from point 63 to point 61 with substrates 31, 33 in fixed rotational position. For the return scan in opposite direction from point 61 to point 63, each of substrates 31, 33 rotates to a second position which may be a 90° rotation, 180° rotation or 270° rotation. After ion beam 35 reaches point 61, and scans along scan length 57 toward point 61 along the first direction, substrates 31, 33 may rotate again. Various degrees of rotation are used in various embodiments such that the entirety of each of substrates 31 and 33 undergoes ion implantation. Each of various ion implantation operations and sequences of ion implantation operations wherein substrates 31, 33 are in different rotational positions for each successive scan and in which substrates 31, 33 are in different spatial locations in each successive scan, are programmable using a processor of the ion implantation apparatus according to the disclosure.

In one exemplary embodiment, ion beam 35 scans in a first linear direction from point 63 to point 61 due to translation or substrates 31 and 33. Each of substrates 31 and 33 then rotates 90° and ion beam 35 scans in the opposite linear direction from point 61 to point 63. Each of substrates 31, 33 then rotates another 90° (total 180°) and ion beam 35 scans in the first linear direction from point 63 to point 61. Substrates 31, 33 then again rotate another 90° in the same direction (total 270°) and ion beam 35 scans in the opposite linear direction from point 61 to point 63. Stated alternatively, substrates 31 and 33 undergo a series of scans and are in different rotational positions for each of the scans of the succession of scans. Other arrangements are used in other embodiments.

Each of substrates 31 and 33 and ion beam 35 is in an ion implantation apparatus. The apparatus includes a processor that is programmable to carry out an implantation operation in which the substrates undergo a series of scans, as above. Each scan includes substrates 31 and 33 translating along a first direction relative to ion beam 35 and in one embodiment, each scan includes substrates 31, 33 being at a different rotational positions with respect to other scans and in one embodiment, each scan includes substrates 31 and 33 being in different positions relative to one another in the different scans.

According to one embodiment, substrates 31, 33 move with respect to one another such as along direction 69 and as described in the arrangements 1-4 of FIG. 3. Substrates 31, 33 have a diameter of 300 mm in one embodiment and a diameter of 450 mm in another embodiment but other sized substrates are used in other embodiments. In one embodiment, total height 49 is about 550-700 mm but this varies in other embodiments and depends upon the relative positioning of substrates 31, 33, and in particular depends upon angle determined by the relative positions of the center points of substrates 31, 33 in a right triangle having one side along direction 37 of translation.

According to the described embodiments, an ion beam having a footprint with a width and height less than two times the diameter of a substrate, can be used to implant all areas of multiple substrates in an ion implantation chamber in one ion implantation operation using one or multiple scans.

FIGS. 5A-5D and FIGS. 6A-6E each show details of an embodiment of two substrates rotating with respect to one another and/or rotating about their individual axes to enable two substrates to be implanted in one ion implantation chamber.

FIGS. 5A-5C illustrate a sequence of operations within an ion implantation chamber. Substrates 31 and 33 are each disposed on stage 75 which is capable of rotation and translation. Ion beam scan area 77 is indicated by the dashed lines and is shaded and defined by width 45 of the ion beam and scan length 79. Although the actual ion beam footprint including width 45 includes a height less than scan length 79, and is in fixed position relative to stage 75, ion beam scan area 77 is produced as a result of stage 75 translating along direction 80. The orientation of each of substrates 31, 33 are indicated by markings 81 which do not represent a physical attribute of substrates 31, 33 but are used merely to indicate the relative position. FIG. 5A shows the arrangement within an ion implantation chamber at time T=1.

At time T=2, 5B shows stage 75 after a rotation of ninety degrees counterclockwise.

FIG. 5C shows the arrangement at time T=3 and shows stage 75 after another counterclockwise rotation of ninety degrees.

FIG. 5D shows the arrangement at time T=4 after a further ninety degrees counterclockwise rotation of stage 75. Throughout the sequence of events shown in FIGS. 5A-5D, ion beam scan area 77 is achieved by the translation of stage 75 back and forth along direction 80. According to the embodiment in FIGS. 5A-5D, the entire surface of each of substrate 31, 33 undergoes ion implantation.

In one embodiment, FIGS. 5A-5D represent two substrates 31, 33 on a platen that rotates and in another embodiment the sequence of operations shown by FIGS. 5A-5D represent substrates 31, 33 on individual platens that move with respect to one another and rotate to achieve the positions shown in FIGS. 5A-5D.

FIGS. 6A-6E show a sequence of operations within an ion implantation chamber in which ion beam width 83 is less than a critical width for substrates of a given size. In the embodiment shown in FIGS. 6A-6E, ion beam scan area 85 represents the footprint determined by width 83 and scan length 89 of the ion beam and is shaded and surrounded by the dotted line which is coincident with dashed lines 91 in FIG. 6A, as will be seen more clearly in FIGS. 6B and 6C. As in previous embodiments, the ion beam has a fixed footprint less than shaded ion beam scan area 85 and ion beam scan length 89 represents stage 87 translating back and forth along direction 90.

Figure 6A:
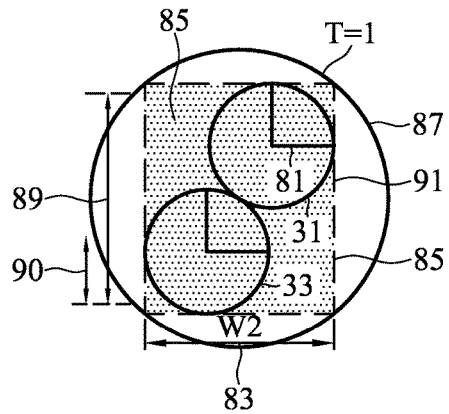
FIGS. 6A-6E show another embodiment in which two substrates are implanted using a single ion beam according to an embodiment of the disclosure.

FIG. 6A shows substrates 31, 33 in an ion implantation chamber at time T=1. The orientation of each of substrates 31, 33 are indicated by markings 81 which do not represent a physical attribute of substrates 31, 33 but are used merely to indicate the relative position.

Figure 6B:
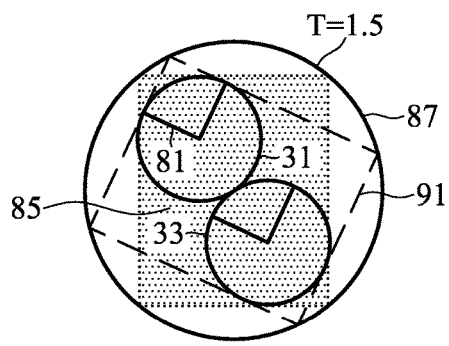

FIG. 6B shows the arrangement at time T=1.5 in which stage 87 rotates as indicated by the rotated position of dashed lines 91.

Figure 6C:
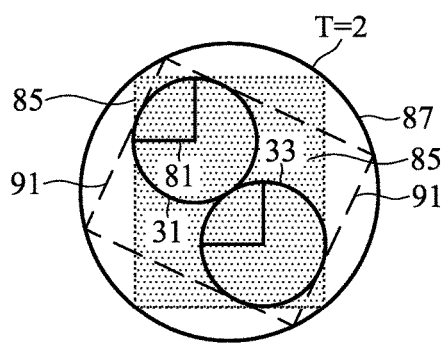

FIG. 6C shows the arrangement at time T=2 in which stage 87 has not rotated relative to its position at time T=1 but substrates 31, 33 have each rotated counterclockwise about their axes.

Figure 6D:
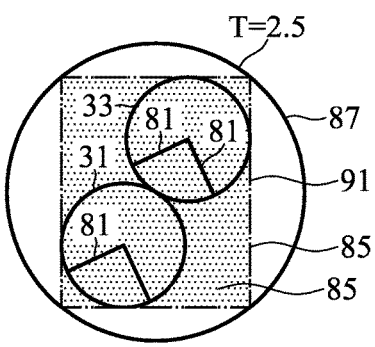
Figure 6E:
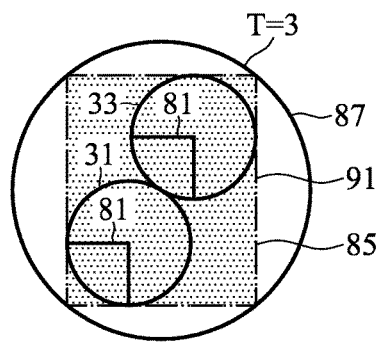

At time T=2.5, FIG. 6D, stage 87 has further rotated along a counterclockwise direction and then at time T=3, FIG. 6E, with stage 87 not having rotated again, each of substrates 31, 33 again have rotated about their respective axes.

FIGS. 6A-6E show embodiments of configurations from time T=1 to time T=3 but it should be understood that further rotations of stage 87 and the individual substrates 31, 33 continue to take place so that each of the substrates 31, 33 is implanted by a single ion beam having an ion beam scan area 85.

The illustrations of FIGS. 5A-5D and 6A-6F are provided to show one embodiment and are not intended to be limiting. In other embodiments, other rotation sequences are used to rotate the substrates and exposes all portions of multiple substrates to the ion beam.

Figure 7:
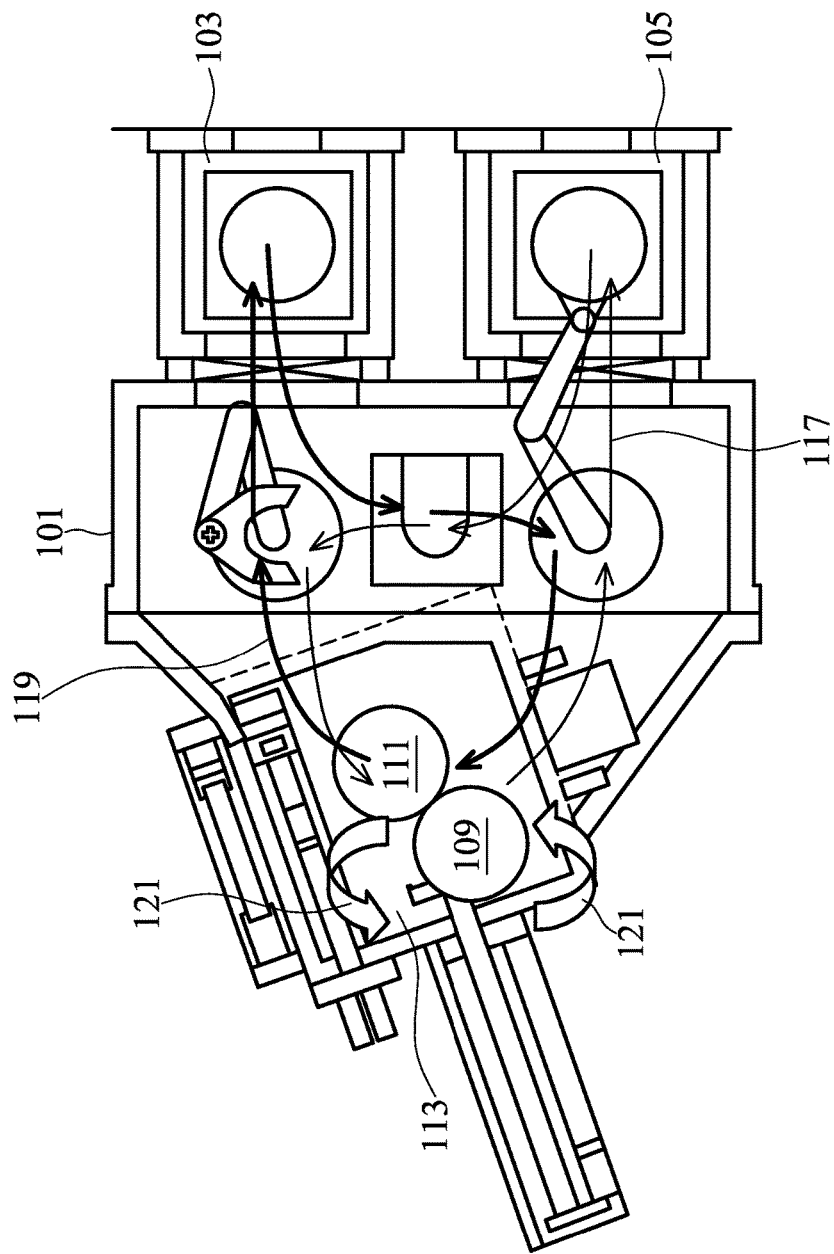
FIG. 7 is a top, cut-away view illustrating an ion implantation apparatus for simultaneously implanting multiple substrates according to an embodiment of the disclosure.

FIG. 7 is a plan view of an ion implantation apparatus according to one embodiment. Ion implantation apparatus 101 includes two load ports 103, 105 and shows the loading procedure for loading two substrates 109, 111 in ion implantation chamber 113. Arrows 117 and 119 show the two different paths of substrates 109 and 111 from load ports 105 and 103, respectively, into ion implantation chamber 113. Arrows 121 indicate the rotation of the platen within ion implantation chamber 113. Other means for loading two substrates into an ion implantation chamber such as ion implantation chamber 113, are used in other embodiments and other arrangements of ion implantation tool 101 are used in other embodiments. Although the disclosure has generally been illustrated with two substrates undergoing ion implantation in an ion implantation chamber, in other embodiments, the ion implantation chamber includes more than two substrates.

In one embodiment, a method for implanting ions into a plurality of substrates is provided. The method comprises positioning a plurality of substrates on a corresponding plurality of translatable and rotatable platens in an ion implantation chamber of an ion implantation tool; generating an ion beam in the ion implantation tool; directing the ion beam to impinge upon the plurality of substrates in the ion implantation chamber; and implanting each of the plurality of substrates by at least one of translating and rotating the plurality of platens relative to the ion beam.

In another embodiment, a method for implanting ions into a plurality of substrates is provided. The method comprises positioning a plurality of substrates on a translatable and rotatable platen in an ion implantation chamber in an ion implantation tool; generating an ion beam in the ion implantation tool; directing the ion beam to impinge upon the platen in the ion implantation chamber; and implanting each of the plurality of substrates while translating and rotating the platen relative to the ion beam.

In another embodiment, an ion implantation apparatus is provided. The ion implantation apparatus comprises an ion beam generator that directs an ion beam toward a plurality of platens in an implantation chamber. Each platen is rotatable and translatable with respect to the ion beam during implantation and capable of receiving at least a substrate thereon.

The word "exemplary" is used herein to mean "serving as an example or illustration." Any aspect or design described herein as "exemplary" is not necessarily to be construed as preferred or advantageous over other aspects or designs.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method comprising:
   (a) positioning a first substrate in an initial position on a first rotatable platen and a second substrate in an initial position on a second rotatable platen, the first and second platens movable with a single rotatable stage in an ion implantation chamber of an ion implantation tool, each substrate having a diameter, wherein the stage is translatable along a straight linear direction past an ion beam, the ion beam having a width wherein a width direction of the width is perpendicular to the linear direction, the width being greater than the diameter of each substrate and less than two times the diameter of each substrate;
   (b) performing a translation of the stage by a scan length in the linear direction or a direction opposite the linear direction, so as to expose an entire surface of each substrate to the ion beam without rotating the first platen, the second platen or the stage during the translation of the stage, such that both the first and second substrates are exposed to the ion beam simultaneously during a portion of the translation of the stage;
   (c) performing a rotation of the stage by a first angle, without rotating the first and second substrates relative to the stage during the rotation of the stage, after step (b);
   (d) performing a rotation of the first and second substrates by a second angle relative to the stage without rotating the stage during rotation of the first and second substrates, after step (b), wherein a sum of the first angle and the second angle is 90 degrees relative to an angular position of the first and second substrates prior to rotation of the stage and rotation of the first and second substrates; and
   (e) repeating steps (b), (c) and (d) one or more times, wherein step (c) is performed at least one time with the first angle less than 90 degrees relative to the angular position of the first and second substrates prior to rotation of the stage, and step (c) is performed at least one time with the first angle greater than 90 degrees relative to the angular position of the first and second substrates prior to rotation of the stage, so as to expose the entire surfaces of both the first and second substrates at a plurality of rotation angles relative to the respective initial positions of the first and second substrates, and rotation of the stage and rotation of the first and second substrates is performed such that the substrates are arranged to have a total width in the width direction and a total width in the linear direction are each less than two times the diameter of each substrate.

2. The method as in claim 1, wherein step (d) rotates the platens more than 90 degrees or less than 90 degrees.

3. The method as in claim 1, wherein a programmed processor in said ion implantation tool causes said ion implantation tool to carry out steps (b) to (d).

4. The method as in claim 1, wherein said translation and rotation implant all surface portions of said first and second substrates.

5. The method as in claim 1, wherein said implanting further comprises moving said plurality of platens relative to one another.

6. The method as in claim 1, further comprising each said platen revolving around a position in said ion implantation chamber.

7. A method comprising:
   (a) positioning a first substrate in an initial position on a first rotatable platen and a second substrate in an initial position on a second rotatable platen, the first and second platens movable with a single rotatable stage in an ion implantation chamber of an ion implantation tool, each substrate having a diameter, wherein the stage is translatable along a straight linear direction past an ion beam, the ion beam having a width, wherein a width direction of the width is perpendicular to the straight linear direction, the width being greater than the diameter of each substrate and less than two times the diameter of each substrate, wherein a line between a center of the first substrate and a center of the second substrate is not parallel to the linear direction;

(b) performing a translation of the stage by a scan length in the linear direction or a direction opposite the linear direction, so as to expose a center portion of both substrates to the ion beam simultaneously without rotating the first platen, the second platen or the stage during the translation of the stage;

(c) performing a rotation of the stage by a first angle without translating the first and second substrates relative to the stage during the rotation of the stage, after step (b);

(d) performing a rotation of the first and second substrates by a second angle relative to the stage without rotating the stage during rotation of the first and second substrates, after step (b), wherein a sum of the first angle and the second angle is 90 degrees relative to an angular position of the first and second substrates prior to rotation of the stage and rotation of the first and second substrates; and (e) repeating steps (b), (c) and (d) one or more times at a plurality of rotation angles relative to the respective initial positions of the first and second substrates, wherein step (c) is performed at least one time with the first angle less than 90 degrees relative to the angular position of the first and second substrates prior to rotation of the stage, and step (c) is performed at least one time with the first angle greater than 90 degrees relative to the angular position of the first and second substrates prior to rotation of the stage, so as to expose the entire surfaces of both the first and second substrates, wherein at a completion of each rotation of the stage, a projection of the first and second substrates on a line extending in the width direction and the linear direction is not greater than the width of the ion beam.

8. The method as in claim 7, wherein said positioning comprises positioning each of said first and second substrates on a corresponding substrate holder, said substrate holders disposed adjacent one another on said platens, wherein said substrates include a diameter of about 300-450 mm and wherein said generating comprises generating an ion beam having a footprint with all lateral dimensions being less than twice as large as said diameter and wherein said implanting implants said first and second substrates.

9. The method as in claim 7, wherein said ion beam includes a footprint having a width of x and a scan length of y and the first and second substrates are positioned such that they are not completely within an area xy.

10. The method as in claim 7, wherein said implanting includes translating said plurality of platens relative to said ion beam using varying speeds.

* * * * *